United States Patent
Hsu et al.

(10) Patent No.: US 7,461,363 B2
(45) Date of Patent: Dec. 2, 2008

(54) SYSTEM AND METHOD FOR ANALYZING RESPONSE VALUES SUM OF DIFFERENTIAL SIGNALS

(75) Inventors: Shou-Kuo Hsu, Taipei Hsien (TW); Cheng-Shien Li, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 173 days.

(21) Appl. No.: 11/615,008

(22) Filed: Dec. 22, 2006

(65) Prior Publication Data

US 2008/0010622 A1   Jan. 10, 2008

(51) Int. Cl.
*G06F 17/50* (2006.01)
*G06F 9/45* (2006.01)

(52) U.S. Cl. .......................................... 716/4; 703/13
(58) Field of Classification Search ...................... 716/1, 716/4, 6, 15; 703/13–14
See application file for complete search history.

(56) References Cited

U.S. PATENT DOCUMENTS

| | | | |
|---|---|---|---|
| 6,781,465 B1 | 8/2004 | Berzins et al. | |
| 6,802,046 B2 * | 10/2004 | Coelho et al. | 716/4 |
| 2003/0208734 A1 * | 11/2003 | Coelho et al. | 716/6 |
| 2004/0138866 A1 * | 7/2004 | Harjung | 703/14 |
| 2004/0163056 A1 * | 8/2004 | Frank et al. | 716/5 |
| 2004/0163058 A1 * | 8/2004 | Frank et al. | 716/5 |
| 2004/0243375 A1 * | 12/2004 | Kundert | 703/14 |
| 2005/0138577 A1 * | 6/2005 | Adamian | 716/1 |

* cited by examiner

*Primary Examiner*—Stacy A Whitmore
(74) *Attorney, Agent, or Firm*—Wei Te Chung

(57) ABSTRACT

A method for analyzing response values sum of differential signals includes: receiving configurations of simulation parameters; simulating differential signal paths with an analog transmission channel according to a design file; analyzing the analog transmission channel into different channel modes according to received configurations; simulating a plurality of pulse signals into the analog transmission channel according to the received configurations, and recording an impulse response of each of the channel modes; simulating differential signal transmissions of the differential signals according to the received configurations, and analyzing the differential signal transmissions into different signal modes corresponding to the different channel modes; transforming each signal mode and the impulse response of a corresponding channel mode to respectively generate a first value and a second value by utilizing Fast Fourier Transform Algorithm; multiplying the first value by the second value to generate a third value, and transforming the third value to a fourth value by utilizing an Inverse Fast Fourier Transform Algorithm; and summing all the fourth values corresponding to all of the channel modes to be the response values sum of the differential signals. A related system is also disclosed.

5 Claims, 6 Drawing Sheets

SYSTEM AND METHOD FOR ANALYZING RESPONSE VALUES SUM OF DIFFERENTIAL SIGNALS

BACKGROUND OF THE INVENTION

1. Field of the Invention

The present invention generally relates to systems and methods for analyzing differential signals, and more particularly to a system and method for analyzing response values sum of differential signals.

2. Description of Related Art

With the continuing technology advancement of computer systems, high-speed serial signals transmitted between components of the computer systems are essential in the computer systems. As schemes of transmitting high-speed serial signals with accurate time-oriented sequential controls are introduced, differential signal paths have attracted people's attention and are configured for transmitting differential signals. Generally, a bit error rate (BER) is generated while the differential signals are transmitted through the differential signal paths, and is a key factor that affects signal quality of the differential signals transmitted. That is, the value of the BER affects a differential signal transmission performance of the differential signal paths.

Therefore, more attention must be paid to the BER of the differential signals transmitted through the differential signal paths before the differential signal paths are utilized. The differential signals are transmitted from a transmitter to a receiver via the differential signal paths, the differential signals with a primal values sum are transmitted from the transmitter, and the differential signals with a response values sum are received by the receiver. It is well known that the response values sum of the differential signals must be analyzed before to analyze the BER.

However, there is no effective equipment/method to quickly and exactly analyze the response values sum of the differential signals when a count of the differential signals is large, and further to analyze the BER according to the response values sum.

What is needed, therefore, is a system and method to analyze a response values sum of differential signals, so as to accurately analyze the BER according to the response values sum, and further to analyze whether the differential signal paths have an acceptable transmission performance according to the BER.

SUMMARY OF THE INVENTION

A system for analyzing response values sum of differential signals in accordance with a preferred embodiment includes a storage device and an analyzing module. The storage device is for storing a design file of differential signal paths. The analyzing module is configured for analyzing the response values sum of the differential signals, and includes a simulator, an analyzing sub-module, a storage sub-module, and a calculating sub-module.

The simulator is configured for receiving configurations of simulation parameters, for simulating the differential signal paths with an analog transmission channel according to the design file, for simulating differential signal transmissions of the differential signals according to received configurations, and for simulating a plurality of pulse signals into the analog transmission channel according to the received configurations. The analyzing sub-module is configured for analyzing the analog transmission channel into different channel modes according to the received configurations, and analyzing the differential signal transmissions into different signal modes corresponding to the different channel modes.

The storage sub-module is configured for recording an impulse response of each of the channel modes when the plurality of pulse signals are being transmitted through the channel modes. The calculating sub-module is configured for transforming each signal mode and the impulse response of a corresponding channel mode to respectively generate a first value and a second value by utilizing Fast Fourier Transform Algorithm, for multiplying the first value by the second value to generate a third value, for transforming the third value to a fourth value by utilizing Inverse Fast Fourier Transform Algorithm, and for summing all the fourth values corresponding to all of the channel modes to be the response values sum of the differential signals.

A method for analyzing response values sum of differential signals in accordance with a preferred embodiment includes the steps of: receiving configurations of simulation parameters; simulating differential signal paths with an analog transmission channel according to a design file; analyzing the analog transmission channel into different channel modes according to received configurations; simulating a plurality of pulse signals into the analog transmission channel according to the received configurations, and recording an impulse response of each of the channel modes; simulating differential signal transmissions of the differential signals according to the received configurations, and analyzing the differential signal transmissions into different signal modes corresponding to the different channel modes; transforming each signal mode and the impulse response of a corresponding channel mode to respectively generate a first value and a second value by utilizing Fast Fourier Transform Algorithm; multiplying the first value by the second value to generate a third value, and transforming the third value to a fourth value by utilizing an Inverse Fast Fourier Transform Algorithm; and summing all the fourth values corresponding to all of the channel modes to be the response values sum of the differential signals.

Other advantages and novel features of the present invention will become more apparent from the following detailed description of preferred embodiments when taken in conjunction with the accompanying drawings.

DETAILED DESCRIPTION OF THE INVENTION

Figure 1:
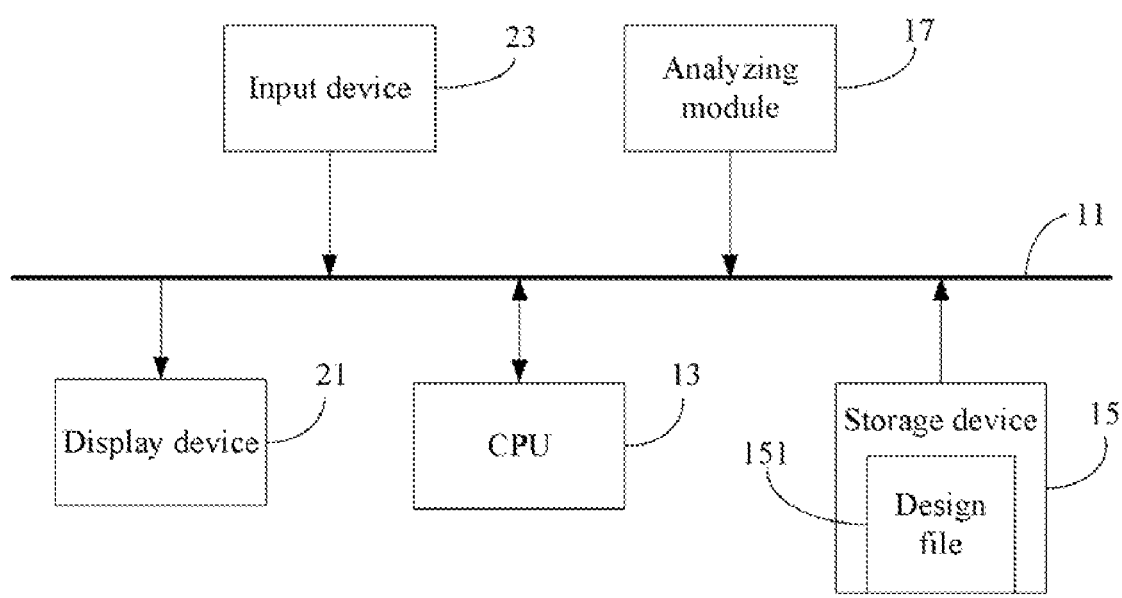
FIG. 1 is a schematic diagram of a hardware configuration of a system for analyzing response values sum of differential signals in accordance with a preferred embodiment.

FIG. 1 is a schematic diagram of a hardware configuration of a system for analyzing response values sum of differential signals (hereinafter, "the system") in accordance with a preferred embodiment. The system is implemented with a computer, and typically includes an input device 23, a storage device 15, a display device 21, a universal serial bus (USB)

11, an analyzing module 17, and a central processing unit (CPU) 13 connected with the input device 23, the storage device 15, the analyzing module 17 and the display device 21 through the USB 11. The storage device 15 is for storing a design file 151 of differential signal paths of a printed circuit board (PCB). The input device 23 is for configuring simulation parameters. The analyzing module 17 is configured for building a differential signal paths model by analyzing the design file, and deriving response values of the differential signal paths model by simulating pulse signals into an analog transmission channel of the differential signal paths model according to the configurations of the simulation parameters. The display device 21 is for displaying data generated by the analyzing module 17, such as the differential signal paths models, the pulse signals, and the response values. The CPU 13 is for processing data among the storage device 15, the display device 21, the input device 23, and the analyzing module 17. The USB 13 is for transmitting data among the CPU 13, the storage device 15, the display device 21, the input device 23, and the analyzing module 17.

Figure 2:
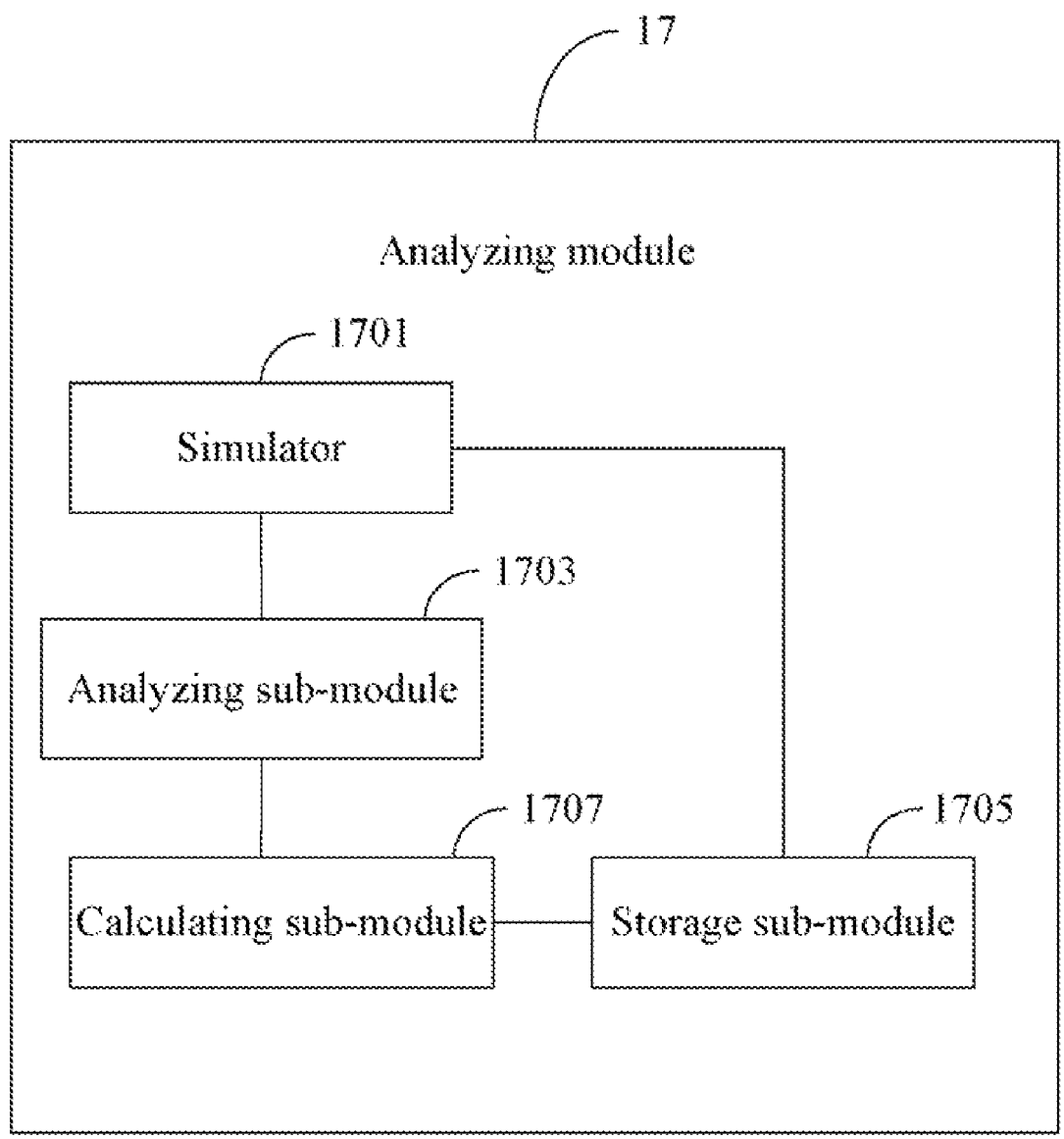
FIG. 2 is a schematic diagram of main function sub-modules of an analyzing module of the system of FIG. 1.

FIG. 2 is a schematic diagram of main function sub-modules of the analyzing module 17. The analyzing module 17 may include a simulator 1701, an analyzing sub-module 1703, a storage sub-module 1705, and a calculating sub-module 1707.

The simulator 1701 is configured for prompting a user interface to receive configurations of the simulation parameters from the input device 23, for loading the design file 151 from the storage device 15, for building the differential signal paths model according to the design file 151, and for simulating a plurality of pulse signals into the analog transmission channel of the differential signal paths model.

Figure 3:
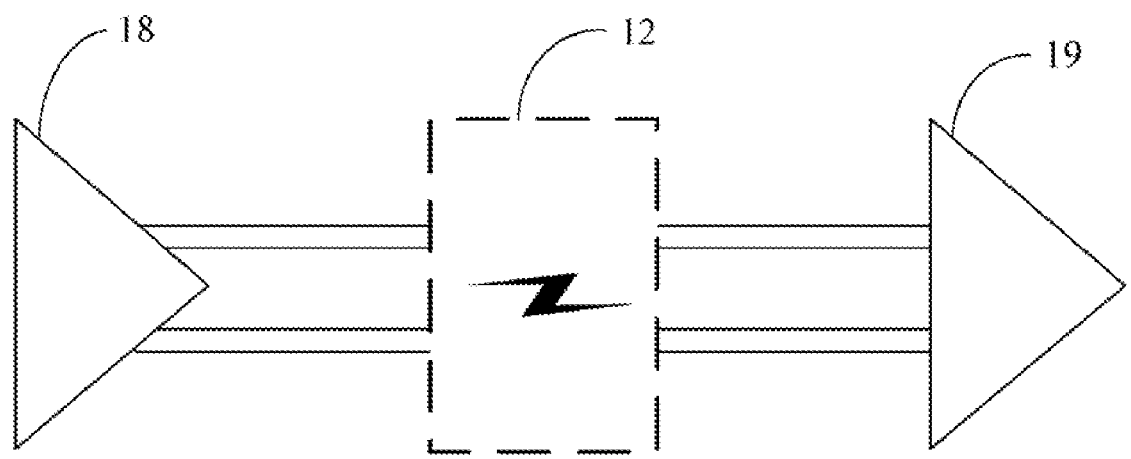
FIG. 3 is a schematic diagram of a differential signal paths model simulated by the analyzing module of FIG. 1.

FIG. 3 is a schematic diagram of the differential signal paths model simulated by the analyzing module 1701. The differential signal paths model simulated by the simulator 1701 typically includes a transmitter 18, the analog transmission channel 12, and a receiver 16. The analyzing module 1701 simulates the analog transmission channel 12 of the differential signal paths model, and simulates a plurality of differential signal transmissions of the differential signal paths model from the transmitter 18 to the receiver 19 via the analog transmission channel 12. The simulation parameters typically include a differential signal value and a differential signal count of the differential signal transmissions of differential signals, and a pulse signal value and a pulse signal count of pulse signal transmissions of pulse signals.

The analyzing sub-module 1703 is configured for analyzing the analog transmission channel 12 into different channel modes according to the differential signal count, and analyzing the plurality of differential signal transmissions into different signal modes corresponding to the different channel modes.

If the differential signal count of the plurality of differential signal transmissions through the analog transmission channel 12 is two, the analog transmission channel 12 and the plurality of differential signal transmissions each has two modes. That is, the different channel modes of the analog transmission channel 12 include a first channel mode and a second channel mode and the different signal modes correspondingly include a first signal mode and a second signal mode.

If the differential signal count of the plurality of differential signal transmissions through the analog transmission channel 12 is larger than two, the analog transmission channel 12 and the plurality of differential signal transmissions each has three modes. That is, the different channel modes of the analog transmission channel 12 include a first channel mode, a second channel mode, and a third channel mode and the different signal modes correspondingly include a first signal mode, a second signal mode, and a third signal mode.

Two differential signals are shown as an example for indicating the operations of the analyzing module 17. The different channel modes include the first channel mode and the second channel mode, and the different signal modes correspondingly include the first signal mode and the second signal mode. The first channel mode corresponds to the first signal mode, and the second channel mode corresponds to the second signal mode.

The simulator 1701 is configured for simulating the plurality of pulse signals into the different channel modes according to the simulation parameters, in order to compute an impulse response of each of the channel modes.

The calculating sub-module 1707 is configured for transforming each of the signal modes to generate a first value by utilizing Fast Fourier Transform Algorithm (FFT), and for transforming an impulse response of each of the channel modes corresponding to generate a second value by utilizing the FFT.

The calculating sub-module 1707 is further configured for multiplying the first value by the second value to generate a third value, for transforming the third value by utilizing Inverse Fast Fourier Transform Algorithm (IFFT) to a fourth value, and for summing all the fourth values corresponding to all of the channel modes to be the response values sum of the differential signals.

Figure 4:
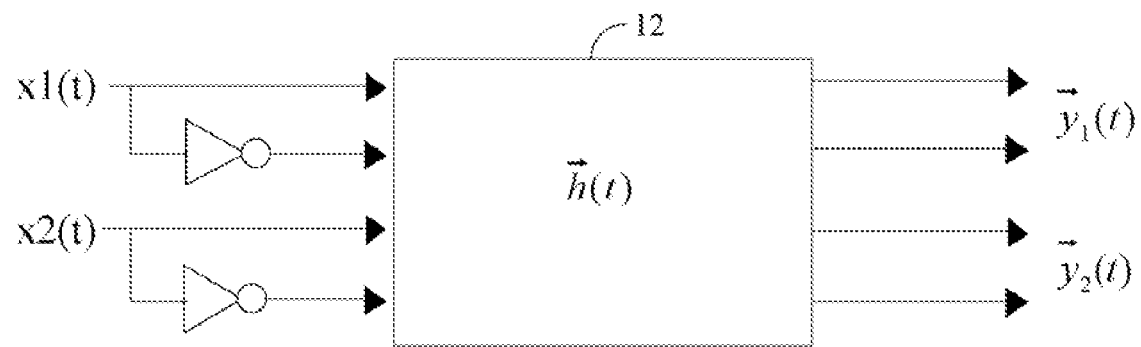
FIG. 4 is a schematic diagram of two differential signal transmissions through an analog transmission channel.

FIG. 4 is a schematic diagram of two differential signal transmissions through the analog transmission channel 12. Two differential signals $x1(t)$ and $x2(t)$ are transmitted through the analog transmission channel 12 with an impulse response "$\vec{h}(t)$", thereby, yielding two response signals $\vec{y}_1(t)$ and $\vec{y}_2(t)$ from the analog transmission channel 12. The analyzing sub-module 1703 analyzes the differential signal $x1(t)$ into a first signal mode (hereinafter, "$\vec{x}_{o1}(t)$"), and a second signal mode (hereinafter, "$\vec{x}_{e1}(t)$"). The analyzing sub-module 1703 analyzes the differential signal $x2(t)$ into a first signal mode (hereinafter, "$\vec{x}_{o2}(t)$") and a second signal mode (hereinafter, "$\vec{x}_{e2}(t)$").

Figure 5:
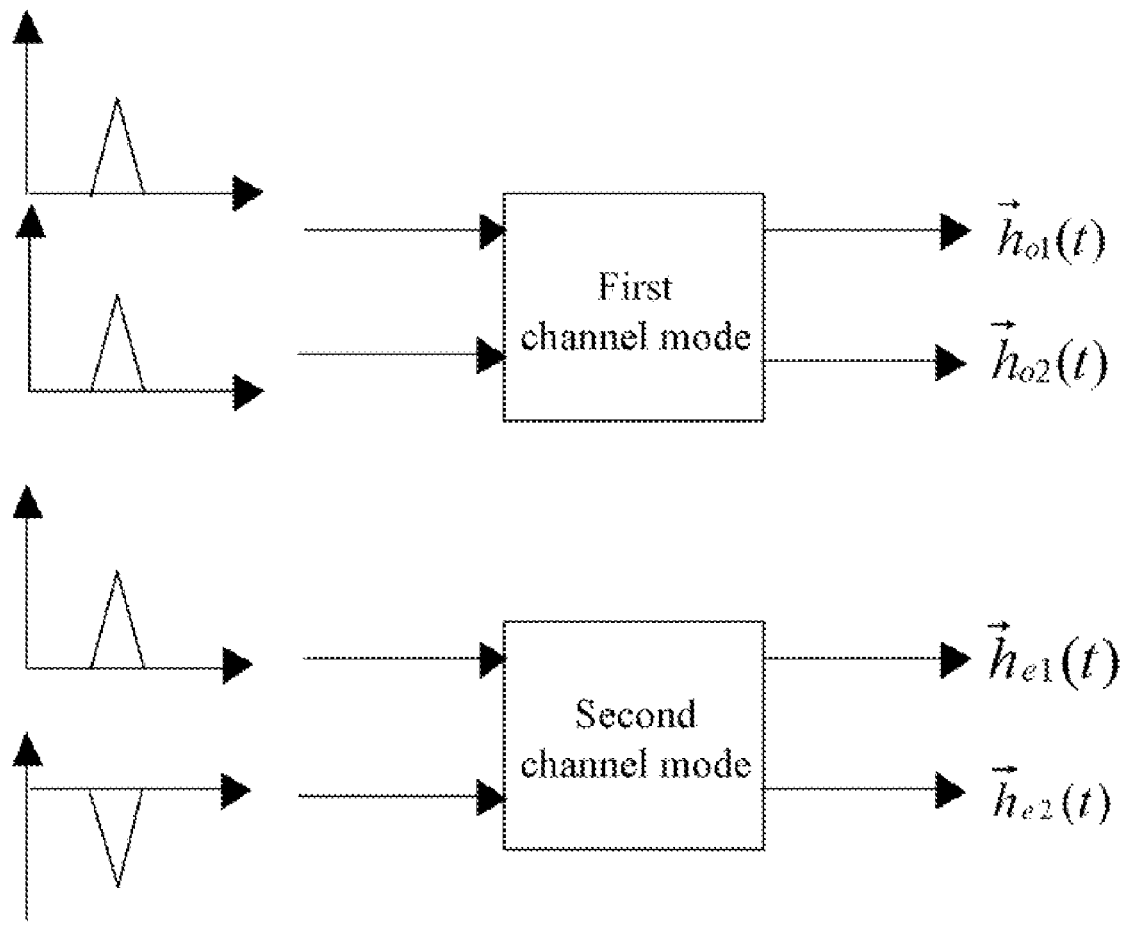
FIG. 5 is a schematic diagram of a plurality of pulse signals transmitted through different channel modes.

FIG. 5 is a schematic diagram of the plurality of pulse signals respectively transmitted through the different channel modes. The first channel mode has two impulse responses "$\vec{h}_{o1}(t)$" and "$\vec{h}_{o2}(t)$", the second channel mode has two impulse responses "$\vec{h}_{e1}(t)$" and "$\vec{h}_{e2}(t)$".

The impulse responses of the different channel modes can be recorded by storage sub-module 1705. The impulse response of the first channel mode is shown as "$\vec{h}_o(t)$", the impulse response of the second channel mode is shown as "$\vec{h}_e(t)$", the impulse response $\vec{h}(t)$ of the analog transmission channel 12 equals a sum of the impulse response $\vec{h}_e(t)$ and the impulse response $\vec{h}_o(t)$. The computing equations of the impulse response $\vec{h}(t)$, the impulse response $\vec{h}_e(t)$ and the impulse response $\vec{h}_o(t)$ are respectively shown as follows:

$$\vec{h}(t) = \vec{h}_e(t) + \vec{h}_o(t), \vec{h}_e(t) = \begin{bmatrix} \vec{h}_{e1}(t) \\ \vec{h}_{e2}(t) \end{bmatrix}, \text{ and } \vec{h}_o(t) = \begin{bmatrix} \vec{h}_{o1}(t) \\ \vec{h}_{o2}(t) \end{bmatrix}.$$

When a differential signal "x(t)" is transmitted from the transmitter 18 to the receiver 19 via the analog transmission channel 12, a corresponding response signal "y(t)" is generated. The corresponding response signal y(t) equals a convolution of the differential signal x(t) and the impulse response $\vec{h}$ (t). An equation of the corresponding response signal y(t) is shown as follow:

$$y(t) = \sum_{\tau=-\infty}^{\infty} x(t-\tau) \cdot h(\tau) = x(t) * h(t),$$

and "*" denotes a convolution operator. That is, an equation of the response signal $\vec{y}_1(t)$ is shown as follow: $\vec{y}_1(t) = \vec{x}_{e1}(t) * \vec{h}_{e1}(t) + \vec{x}_{o1}(t) * \vec{h}_{o1}(t)$, an equation of the response signal $\vec{y}_2(t)$ is shown as follow: $\vec{y}_2(t) = \vec{x}_{e2}(t) * \vec{h}_{e2}(t) + \vec{x}_{o2}(t) * \vec{h}_{o2}(t)$. The FFT is used for transforming a time function into a frequency function. The frequency function is shown as follow:

$$F(\omega) = \int_{-\infty}^{\infty} y(t) \cdot e^{-j\omega t} d\omega,$$

ω=2#f, and "j" denotes a constant. The equation of the corresponding response signal y(t) is also shown as follow:

$$y(t) = x(t) * h(t)$$
$$= \sum_{\tau=-\infty}^{\infty} x(t-\tau) \cdot h(\tau)$$
$$= F^{-1}(F(x(t)) \cdot F(h(t))).$$

Figure 6:
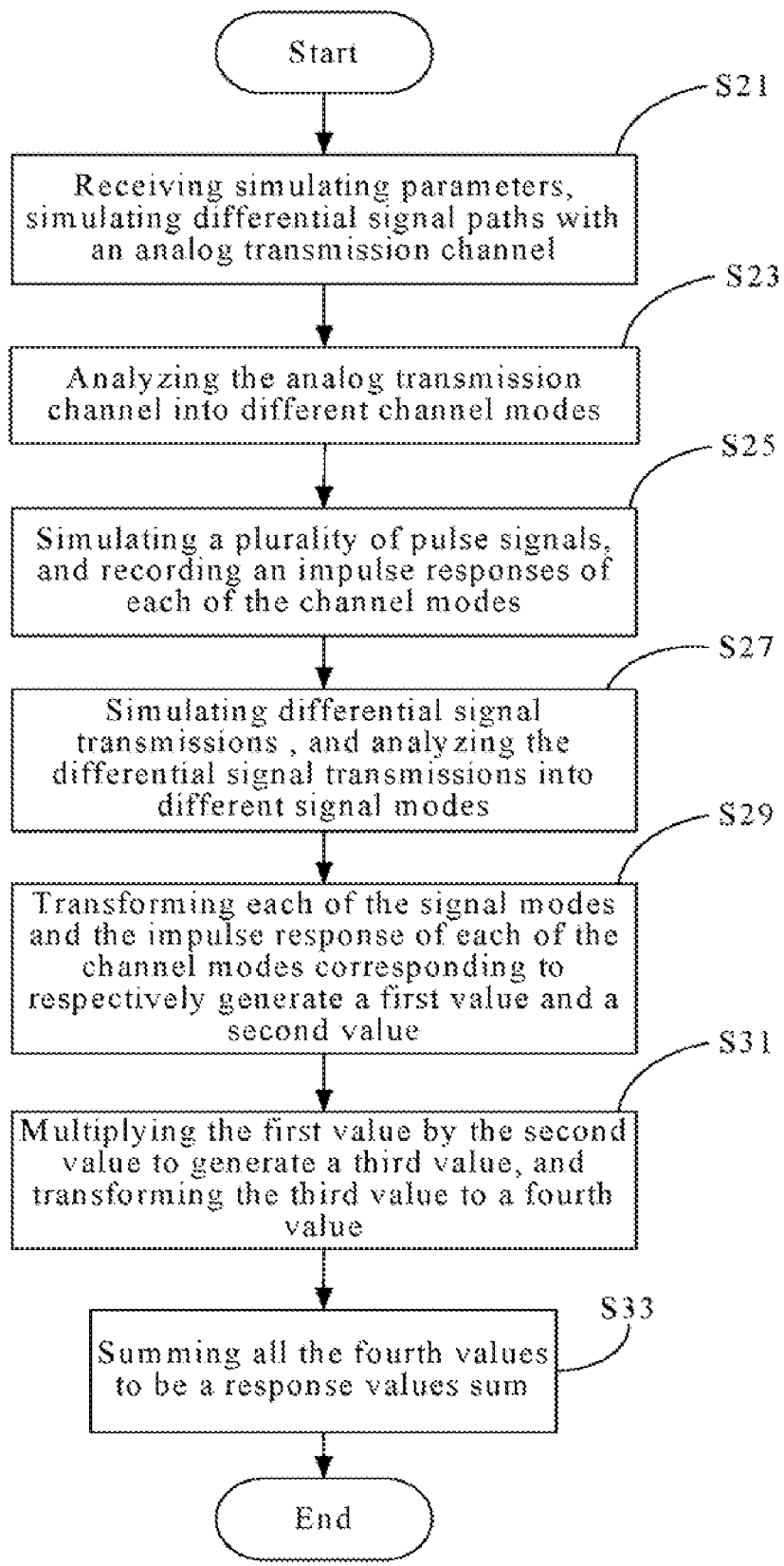
FIG. 6 is a flowchart of a method for analyzing response values sum of differential signals in accordance with a preferred embodiment.

FIG. 6 is a flowchart of a method for analyzing response values sum of differential signals in accordance with the preferred embodiment. In the preferred embodiment, the system may be used to analyze the sum response value of the differential signals that are transmitted through the differential signal paths based on the design file 151. In step S21, the CPU 13 activates the analyzing module 17. The simulator 1701 prompts the user interface to receive configurations of the simulation parameters via the input device 23, loads the design file 151 from the storage device 15, builds the differential signal paths model according to the design file 151. The display device 21 displays the differential signal paths model.

In step S23, the analyzing sub-module 1703 analyzes the analog transmission channel 12 into the different channel modes according to the differential signal count.

In step S25, the simulator 1701 simulates the plurality of pulse signals into the analog transmission channel 12 of the differential signal paths model, according to the pulse signal value and the pulse signal count. The storage sub-module 1705 records an impulse response of each of the channel modes. The display device 21 displays the plurality of pulse signals and the different channel modes.

In step S27, the simulator 1701 simulates the plurality of differential signal transmissions of the differential signal paths model from the transmitter 18 to the receiver 19 via the analog transmission channel 12, according to the differential signal value and the differential signal count. The analyzing sub-module 1703 analyzes the plurality of differential signal transmissions into the different signal modes corresponding to the different channel modes.

In step S29, the calculating sub-module 1707 transforms each of the signal modes to generate the first value by utilizing the FFT, and transforms the impulse response of each of the channel modes corresponding to generate the second value by utilizing the FFT.

In step S31, the calculating sub-module 1707 multiplies the first value by the second value to generate the third value, and transforms the third value by utilizing the IFFT to the fourth value.

In step S33, the calculating sub-module 1707 sums all the fourth values corresponding to all of the channel modes to be the response values sum of the differential signals. The display device 21 displays the response values sum.

It should be emphasized that the above-described embodiments of the preferred embodiments, particularly, any "preferred" embodiments, are merely possible examples of implementations, merely set forth for a clear understanding of the principles of the invention. Many variations and modifications may be made to the above-described preferred embodiment(s) without departing substantially from the spirit and principles of the invention. All such modifications and variations are intended to be included herein within the scope of this disclosure and the above-described preferred embodiment(s) and protected by the following claims.

What is claimed is:

1. A system for analyzing response values sum of differential signals, the system comprising:
    a storage device for storing a design file of differential signal paths restraining the differential signals; and
    an analyzing module configured for analyzing the response values sum of the differential signals, the analyzing module comprising:
        a simulator configured for receiving configurations of simulation parameters, for simulating the differential signal paths with an analog transmission channel according to the design file, for simulating differential signal transmissions of the differential signals according to received configurations, and for simulating a plurality of pulse signals into the analog transmission channel according to the received configurations;
        an analyzing sub-module configured for analyzing the analog transmission channel into different channel modes according to the received configurations, and analyzing the differential signal transmissions into different signal modes corresponding to the different channel modes;
        a storage sub-module configured for recording an impulse response of each of the channel modes when the plurality of pulse signals are being transmitted through the channel modes; and
        a calculating sub-module configured for transforming each signal mode and the impulse response of a corresponding channel mode to respectively generate a first value and a second value by utilizing Fast Fourier Transform Algorithm, for multiplying the first value by the second value to generate a third value, for transforming the third value to a fourth value by utilizing Inverse Fast Fourier Transform Algorithm, and for summing all the fourth values corresponding to all of the channel modes to be the response values sum of the differential signals.

2. The system as claimed in claim 1, wherein the simulation parameters comprise a differential signal value and a differential signal count of the differential signal transmissions, and a pulse signal value and a pulse signal count of the plurality of pulse signal transmissions.

3. The system as claimed in claim 1, further comprising:
a display device for displaying data generated by the analyzing module.

4. A method for analyzing a response value of differential signals, the method comprising the steps of:
receiving configurations of simulation parameters;
simulating differential signal paths with an analog transmission channel according to a design file;
analyzing the analog transmission channel into different channel modes according to received configurations;
simulating a plurality of pulse signals into the analog transmission channel according to the received configurations, and recording an impulse response of each of the channel modes;
simulating differential signal transmissions of the differential signals according to the received configurations, and analyzing the differential signal transmissions into different signal modes corresponding to the different channel modes;
transforming each signal mode and the impulse response of a corresponding channel mode to respectively generate a first value and a second value by utilizing Fast Fourier Transform Algorithm;
multiplying the first value by the second value to generate a third value, and transforming the third value to a fourth value by utilizing Inverse Fast Fourier Transform Algorithm; and
summing all the fourth values corresponding to all of the channel modes to be the response values sum of the differential signals.

5. The method as claimed in claim 4, wherein the simulation parameters comprise a differential signal value and a differential signal count of the differential signal transmissions, and a pulse signal value and a pulse signal count of the plurality of pulse signal transmissions.

* * * * *